(12) United States Patent
Ufert

(10) Patent No.: US 7,718,537 B2  
(45) Date of Patent: May 18, 2010

(54) METHOD FOR MANUFACTURING A CBRAM SEMICONDUCTOR MEMORY

(75) Inventor: Klaus-Dieter Ufert, Unterschleissheim (DE)

(73) Assignee: Qimonda AG, Munich (DE)

( * ) Notice: Subject to any disclaimer, the term of this patent is extended or adjusted under 35 U.S.C. 154(b) by 1266 days.

(21) Appl. No.: 11/238,117

(22) Filed: Sep. 29, 2005

(65) Prior Publication Data  
US 2006/0068528 A1  Mar. 30, 2006

(30) Foreign Application Priority Data  
Sep. 30, 2004  (DE) .................. 10 2004 047 630

(51) Int. Cl.  
    *H01L 21/302* (2006.01)
(52) U.S. Cl. .............. 438/712; 438/238; 438/710
(58) Field of Classification Search ............. 438/257, 438/708, 710, 720, 238, 706.708, 712; 216/58.67  
See application file for complete search history.

(56) References Cited

U.S. PATENT DOCUMENTS

| | | | |
|---|---|---|---|
| 4,276,368 A | | 6/1981 | Heller |
| 4,320,191 A | * | 3/1982 | Yoshikawa et al. .......... 430/296 |
| 4,368,099 A | * | 1/1983 | Huggett et al. ................ 216/48 |
| 6,344,116 B2 | * | 2/2002 | Warner et al. .......... 204/298.02 |
| 6,813,178 B2 | * | 11/2004 | Campbell et al. ........... 365/148 |
| 2003/0034244 A1 | * | 2/2003 | Yasar et al. ............... 204/192.3 |
| 2003/0045049 A1 | | 3/2003 | Campbell |
| 2003/0209971 A1 | | 11/2003 | Kozicki |

FOREIGN PATENT DOCUMENTS

| | | |
|---|---|---|
| DE | 3344491 A1 | 6/1985 |
| DE | 69023786 T2 | 6/1996 |
| WO | WO-03/065456 A2 | 8/2003 |

* cited by examiner

*Primary Examiner*—Lan Vinh  
(74) *Attorney, Agent, or Firm*—Slater & Matsil, L.L.P.

(57) ABSTRACT

A method for manufacturing CBRAM switching elements and CBRAM semiconductor memories with improved switching characteristics so as to remove superfluous, weak, cluster-like, or unbound selenium at the surface of a GeSe layer is solved by the present invention in that, after the generation of an active matrix material or GeSe layer, respectively, a reactive sputter etching process is performed in which the surface layer of the active matrix material or GeSe layer, respectively, is removed at least partially so as to modify the surface structure thereof.

23 Claims, 1 Drawing Sheet

METHOD FOR MANUFACTURING A CBRAM SEMICONDUCTOR MEMORY

CLAIM FOR PRIORITY

This application claims the benefit of priority to German Application No. 10 2004 047 630.6 which was filed in the German language on Sep. 30, 2004, the contents of which are hereby incorporated by reference.

TECHNICAL FIELD OF THE INVENTION

The invention relates to a semiconductor memory with resistively switching memory cells and to a method for manufacturing a semiconductor memory device with non-volatile, resistively switching memory cells.

BACKGROUND OF THE INVENTION

In a semiconductor memory device, a cell field consisting of a plurality of memory cells and a matrix of column and row supply lines or word and bit lines, respectively, is usually built up. The actual memory cell is positioned at the crosspoints of the supply lines that are made of electroconductive material. The column and row supply lines or word and bit lines, respectively, are each electrically connected with the memory cell via an upper or top electrode and a lower electrode or bottom electrode. To perform a change of the information content in a particular memory cell at the addressed crosspoint, or to recall the content of the memory cell, the corresponding word and bit lines are selected and impacted either with a write current or with a read current. To this end, the word and bit lines are controlled by appropriate control means.

A plurality of kinds of semiconductor memories are known, e.g. a RAM (Random Access Memory) comprising a plurality of memory cells that are each equipped with a capacitor which is connected with a so-called selection transistor. By selectively applying a voltage at the corresponding selection transistor via the column and row supply lines, it is possible to store electric charge as an information unit (bit) in the capacitor during a write process and to recall it again during a read process via the selection transistor. A RAM memory device is a memory with optional access, i.e. data can be stored under a particular address and can be read out again under this address later.

Another kind of semiconductor memories are DRAMs (Dynamic Random Access Memory) which comprise in general only one single, correspondingly controlled capacitive element, e.g. a trench capacitor, with the capacitance of which one bit each can be stored as charge. This charge, however, remains for a relatively short time only in a DRAM memory cell, so that a so-called "refresh" must be performed regularly, e.g. approximately every 64 ms, wherein the information content is written in the memory cell again.

Contrary to this, the memory cells of so-called SRAMS (Static Random Access Memories) usually comprise a number of transistors each. In contrast to DRAMs, no "refresh" has to be performed in the case of SRAMs since the data stored in the transistors of the memory cell remain stored as long as an appropriate supply voltage is fed to the SRAM. Only in the case of non-volatile memory devices (NVMs), e.g. EPROMs, EEPROMs, and flash memories do the stored data remain stored even when the supply voltage is switched off.

The presently common semiconductor memory technologies are primarily based on the principle of charge storage in materials produced by standard CMOS (complement metal oxide semiconductor) processes. The problem of the leaking currents in the memory capacitor existing with the DRAM memory concept, which results in a loss of charge or a loss of information, respectively, has so far been solved insufficiently only by the permanent refreshing of the stored charge. The flash memory concept underlies the problem of limited write and read cycles with barrier layers, wherein no optimum solution has been found yet for the high voltages and the slow read and write cycles.

Since it is intended to accommodate as many memory cells as possible in a RAM memory device, one has been trying to realize them as simple as possible and on the smallest possible space, i.e. to scale them. The previously employed memory concepts (floating gate memories such as flash und DRAM) will, due to their functioning that is based on the storing of charges, presumably meet with physical scaling limits within foreseeable time. Furthermore, in the case of the flash memory concept, the high switching voltages and the limited number of read and write cycles, and in the case of the DRAM memory concept the limited duration of the storage of the charge state, constitute additional problems.

As approaches for solving these problems, so-called CBRAM (CB=Conductive Bridging RAM) memory cells have recently become known in prior art, in which it is possible to store digital information by a resistive switching process. The CBRAM memory cell may be switched between different electric resistance values by bipolar electric pulsing. In the simplest embodiment, such an element may be switched between a very high (e.g. in the GOhm range) and a distinctly lower resistance value (e.g. in the kOhm range) by applying short current or voltage pulses. The switching rates may be less than a microsecond.

In the case of CBRAM memory cells, an electrochemically active material, e.g. a so-called chalcogenide material of germanium (Ge), selenium (Se), copper (Cu), sulphur (S), and/or silver (Ag) is present in a volume between a first electrode or top electrode and a lower electrode or bottom electrode, for instance, in a GeSe, GeS, AgSe, or CuS compound. The abovementioned switching process is, in the case of the CBRAM memory cell, based on principle on the fact that, by applying appropriate current or voltage pulses of specific intensity and duration at the electrodes, elements of a so-called deposition cluster continue to increase in volume in the active material positioned between the electrodes until the two electrodes are finally bridged in an electroconductive manner, i.e. are electroconductively connected with each other, which corresponds to the electroconductive state of the CBRAM cell.

By applying correspondingly inverse current or voltage pulses, this process may be reversed again, so that the corresponding CBRAM memory cell can be returned to a non-conductive state. This way, a "switching over" between a state with a higher electroconductivity of the CBRAM memory cell and a state with a lower electroconductivity of the CBRAM memory cell may be achieved.

The switching process in the CBRAM memory cell is substantially based on the modulation of the chemical composition and the local nanostructure of the chalcogenide material doped with a metal, which serves as a solid body electrolyte and a diffusion matrix. The pure chalcogenide material typically has a semiconductor behavior and has a very high electric resistance at room temperature, said electric resistance being by magnitudes, i.e. decimal powers of the ohmic resistance value higher than that of an electroconductive metal. By the current or voltage pulses applied via the electrodes, the steric arrangement and the local concentration of the ionically and metallically present components of the mobile element in the diffusion matrix is modified. Due to that, the co-called bridging, i.e. an electrical bridging of the volume between the electrodes of metal-rich depositions, may be caused, which modifies the electrical resistance of the CBRAM memory cell by several magnitudes in that the ohmic resistance value is reduced by several decimal powers.

The surfaces of vitreous GeSe layers of the chalcogenide material that are deposited by means of sputtering methods have an amorphous structure and frequently contain superfluous selenium that is poorly bound with respect to the valency bond with germanium. In a method that his known from the document U.S. 2003/0155606, a tempering process is performed at 250° C. in an oxygen atmosphere to oxidize the selenium at the layer surface of the GeSe layer and to evaporate it. The disadvantage of this method consists in that the entire memory device is heated with this tempering, so that an undesired modification of the layer characteristics or interface interdiffusions may occur.

Moreover, the thermal energies that are employed with this method for dissolving the selenium agglomerations lie within the meV range. In this energy range, however, only those selenium atoms that are very weakly bound, i.e. that are practically unbound, can be deactivated or solved out. Weakly bound selenium atoms or selenium atoms that are conglomerated like clusters cannot be removed with this known method and thus lead to the formation of AgSe conglomerates in the Ag doping and electrode layer.

In another method known from U.S. 2003/0045049, the treatment of the surface with an oxygen or hydrogen plasma or other chemicals is suggested so as to generate a passivation layer on the GeSe layer. The only object of this method, however, is to form a passivation layer at the surface of the Ag-doped GeSe layer. The oxide passivation layers that are formed with different oxygen treatments tend to crystallize at low temperatures already. The oxide layer therefore does not behave chemically inert to the Ag electrode, i.e. the formation of silver oxide may take place at the interface of the Ge oxide layer with the Ag electrode, which is of disadvantage for the function of the CBRAM memory cell. Furthermore, the passivation layer that has to be sufficiently chemically compact to be able to prevent the formation of conglomerates also forms an electronic barrier modifying or preventing the contact to the top electrode and thus the switching behavior.

SUMMARY OF THE INVENTION

The present invention provides a method for manufacturing CBRAM switching devices and CBRAM semiconductor memories with improved switching characteristics, wherein superfluous, weak, cluster-like, or unbound selenium at the surface of a GeSe layer is removed. The present invention also prevents depositions at the surface of vitreous, amorphous GeSe layers that were deposited by means of sputtering, and thus enabling a homogeneous deposition of a silver doping layer on the GeSe layer.

In accordance with one embodiment of the present invention, there is a method for manufacturing a resistively switching CBRAM semiconductor memory in which a matrix material or a GeSe layer, respectively, is generated which is adapted to be placed in a more or less electroconductive state, wherein a reactive sputter etching process is performed after the generation of the matrix material or GeSe layer, respectively, in which the surface layer of the active matrix material or GeSe layer, respectively, is removed at least partially to modify the surface structure thereof.

In one aspect of the invention, a reactive sputter etching process is performed to clean the surface structure of the GeSe layer of the active matrix material layer. In so doing, the chemical bonds of the surface structure of the GeSe layer are re-organized and the superfluous, weakly bound or clustered selenium is in particular removed. The application of this reactive sputter etching method conveys the advantage that only the surface of the GeSe layer is heated for a short time by the plasma radiation and by the relatively low kinetic energy of the sputter ions, so that an undesired heating of the entire memory device may be avoided.

The energy of the sputter particles that is generated by the bias voltage with which the substrate or the GeSe layer, respectively, is impacted, lies in the range of few eV and can be adjusted in a controlled manner. The sputter particles hitting the GeSe layer solve primarily weaker-bound selenium and Ge atoms as well as selenium clusters, but also undesired impurities, out of the surface of the GeSe layer and thus improve the surface structure thereof. This results in an improvement of the adhesion of the Ag doping layer that is to be applied in a subsequent process step.

Since the sputter etching is a plasma method, the GeSe layer surface is also partially irradiated with photons generated in the plasma in the UV-range. This radiation activates the layer surface of the GeSe layer by supplying potential energy, so that it is easier for the oxygen or hydrogen ions from the reactive gas/sputter gas mixture to form a volatile selenium compound with the selenium at the surface of the GeSe layer.

In a particularly advantageous manner, the above-described process of the inventive method can be performed without an interruption of the vacuum with the same equipment of the coating facility directly subsequent to the deposition of the GeSe layer. Likewise, the Ag doping layer may be deposited without interruption in a subsequent process step. This entails another advantage of the method according to the present invention since no clogging of the GeSe layer surface with impurities caused by an interruption of the vacuum can take place. Thus, there are optimum conditions for the homogeneous layer formation of the Ag doping layer, with the formation of AgSe clusters being prevented.

In contrast to the above-described prior art methods, in the present invention, no new layer is consequently deposited on the GeSe layer during a process step after the formation of the active matrix material layer, but the selenium-rich surface layer is firstly removed by means of reactive sputter etching so as to prevent the formation of AgSe conglomerates in the Ag doping layer that is to be deposited subsequently.

The invention substantially based on three process mechanisms that are used by means of this method so as to pre-treat the GeSe layer surface such that the subsequent Ag doping layer is deposited homogeneously without forming disturbing conglomerates. The first process mechanism is performed in a backsputtering process in which, by pulse transmission of the penetrating sputter ions, surface atoms, i.e. both germanium atoms and selenium atoms, as well as impurity atoms are equally solved from the surface. Thus, the surface of the GeSe layer is cleaned and re-organized, so that improved conditions for a homogenous layer formation of the subsequent Ag doping layer on the surface of the GeSe layer are created.

The second process mechanism of the invention relates to the surface activation of the GeSe layer, i.e. the activation of the surface atoms by the energy-rich plasma radiation and in particular by the UV proportion thereof. By this excitation, the surface atoms are activated, so that they have sufficient potential energy to form a compound with the atoms of the reactive gas or sputter gas, respectively.

The third process mechanism of the invention includes the use of oxygen or hydrogen as sputter and reactive gas. The sputter ions hitting the GeSe layer with lower energy accumulate predominantly in layers close to the surface of the GeSe layer and react there in particular with weakly bound selenium atoms to form volatile selenium oxide or hydrogen selenide. Thus, superfluous and weakly bound selenium is removed from the surface of the GeSe layer in conglomerate form, too. Without the formation of volatile selenium oxide or hydrogen selenide, the corresponding selenium atoms would be available to form clusters with the Ag atoms of the doping layer. The inventive method is also applicable to any other selenium-containing, vitreous materials in thin layer form.

In a sputter coating facility, e.g. the facility ZV 6000 of the company Leybold or similar facilities of the company KDF, three different so-called sputter targets may be used without interruption of the vacuum. The wafers or substrates used for the inventive manufacturing method preferably already comprise structures for a W bottom electrode and vias in the insulator layer with the appropriate dimensions. According to a preferred embodiment of the inventive method, the GeSe layer is deposited in the vias of the memory device by means of rf-magnetron sputtering of a GeSe compound target in a first process step. To this end, argon is commonly used as a sputter gas at a pressure of approx. 4 to $7 \times 10^{-3}$ mbar and a HF sputter power in the range of approx 1 to 3 kW. The layer thickness of the GeSe layer generated is approx. 50 nm.

In still another embodiment according to the present invention, a bias voltage of approx. 300 to 500 V is applied to the substrate or to the memory device with the GeSe layer, respectively. This way, the GeSe layer itself constitutes the so-called target that is removed during the reactive sputter etching process. The bias voltage is chosen so low in this case in order that the sputter ions cannot penetrate deeper into the GeSe layer. The process gas may consist of pure oxygen, hydrogen, or of an $Ar/O_2$, $Ar/H_2$. Alternatively, any other inert gas/reactive gas mixture that results in the formation of a volatile selenium compound may also be used.

To increase the etching effect of the reactive sputter etching process, a somewhat higher gas pressure, preferably up to the range of some $10^{-2}$ to $3 \times 10^{-3}$ mbar, may be chosen. This process step modifies the surface of the GeSe layer, i.e. to remove foreign atoms and in particular selenium enrichments therefrom. Therefore, the active sputter time can be restricted to few minutes and lies preferably in the range of 1 to 3 minutes. During this process step, no potential is present at the GeSe compound target.

With these process steps, a layer thickness of approx. 2 nm to 5 nm is removed due to the combination of the solving out of the Se atoms by mechanical pulse transmission of the inert gas or reactive gas ions, and due to the chemical reaction of the reactive gas with the selenium to form a volatile selenium compound. As a result of the invention, the selenium is strongly bound in valency bonds at the newly created GeSe layer surface and is no longer available in sufficient concentration for the formation of a conglomerate with the subsequently applied Ag doping layer.

For the deposition of the Ag doping layer in the subsequent process step, the gas mixture used during the above-explained sputter etching process, or the pure reactive gas, respectively, is pumped off the processing chamber of the sputter coating facility, and an inert gas that is used for the sputter process with which the Ag doping layer is deposited is supplied. To this end, a dc-magnetron sputter process with an Ag element target is usually performed. As sputter parameters, argon (or another inert gas) is, as a rule, used as a sputter gas at a pressure of approx. 4 to $7 \times 10^{-3}$ mbar and a dc-sputter power in the range of approx. 1 to 3 kW.

By means of the above-described multi-part process it is possible to deposit the GeSe layer of a CBRAM switching element or of a CBRAM semiconductor memory in one single sputter coating facility and without intermediate ventilation, i.e. to sputteretch it reactively, and to deposit the Ag doping layer homogeneously without the formation of Ag conglomerates, on the surface of the GeSe layer.

BRIEF DESCRIPTION OF THE DRAWINGS

In the following, the invention will be explained in more detail with reference to the exemplary embodiments and drawing, in which.

DETAILED DESCRIPTION OF THE INVENTION

Figure 1:
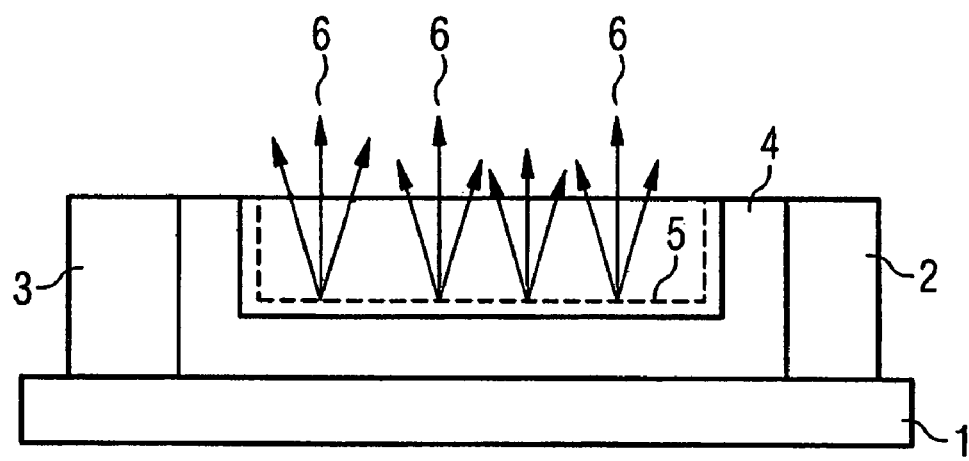
FIG. 1 shows a CBRAM memory cell of a resistively switching CBRAM semiconductor memory during the manufacturing process according to one embodiment of the invention.

FIG. 1 shows the schematic structure of a CBRAM memory cell of a resistively switching CBRAM semiconductor memory during the manufacturing process according to a preferred embodiment of the present invention. The state or structure, respectively, is shown which the CBRAM memory cell has at the point of time of the reactive sputter etching process.

The CBRAM memory cell illustrated in the drawing comprises a layer stack of material layers that are constructed on a substrate and are manufactured in several process steps. The lowermost layer constitutes a first electrode or bottom electrode 1 whereas the uppermost layer comprises a second electrode or top electrode (not illustrated). Since the drawing shows the CBRAM memory cell during the manufacturing process in a state prior to the generation of the second electrode or top electrode, this electrode is not illustrated. After the termination of the manufacturing process, the CBRAM memory cell is connected with the electric supply lines, the column and row supply lines or word and bit lines, respectively, of the semiconductor memory via the two electrodes above and below the layer stack. The electrodes 1 are usually manufactured in a sputter process by using an Ag sputter target of silver.

After the generation of the first electrodes 1, an active matrix material layer with a GeSe layer 4 is deposited. The matrix material layer or GeSe layer 4 is doped in a later step of the manufacturing process with silver ions as mobile material and comprises an amorphous, micromorphous, or microcrystalline structure. To this end, an Ag doping layer (not shown) is applied on the GeSe layer 4 which serves the doping of the matrix material layer 3 with silver ions, and the doping layer is followed by the layer of the second electrode (not shown). The wafers used for the inventive method preferably have prefabricated structures for a W bottom electrode and corresponding vias in the insulator layer with the necessary dimensions. FIG. 1 reveals the inclusion of the active matrix material or the GeSe layer 4 in the via of a CBRAM memory device. The material layers of the CBRAM memory cell are limited laterally by a respective dielectric 2 and 3 so as to prevent a lateral diffusing out of the material layers.

During the deposition of the Ag doping layer on the GeSe layer 4, a formation of disturbing conglomerates may occur in the surface layers 5 of the GeSe layer 4, which impair the function of the CBRAM memory cell and which are avoided by the method according to the present invention.

According to the invention, these disadvantages are avoided in that a reactive sputter etching process is performed after the generation of the GeSe layer 4, in which the surface layer 5 of the GeSe layer 4 is removed at least partially so as to modify the surface structure of the GeSe layer 4 or the active matrix material layer, respectively. Chemical bonds of the surface structure of the GeSe layer 4 are re-organized and the superfluous, weakly bound or clustered selenium is in particular removed.

The sputter particles hitting the surface 5 of the GeSe layer 4 during the reactive sputter etching process solve predominantly weaker-bound selenium and germanium atoms as well as selenium clusters, but also undesired impurities out of the surface layers 5 of the GeSe layer 4 and thus improve the surface structure thereof. In so doing, reactively sputtered particles of Se, $SeO_x$, $H_2Se$, and Ge are, for instance, generated. The dissolution of weakly bound selenium and germanium atoms, selenium clusters, and impurities from the surface 5 of the GeSe layer 4 is indicated in the drawing by the arrows 6.

In the case of reactive sputter etching, the surface layers 5 of the GeSe layer 4 are at least partially removed due to the combination of the solving out of the Se atoms by mechanical pulse transmission of the inert gas or reactive gas ions and by the chemical reaction of the reactive gas with the selenium to form a volatile selenium compound, which is indicated in the drawing by the dashed line at the surface layers 5 of the GeSe layer 4.

As a result of the invention, the selenium is strongly bound in valency bonds at the newly generated GeSe layer surface 5 and is no longer available in sufficient concentration for the formation of a conglomerate with the subsequently applied Ag doping layer. This results in an improved adhesion of the Ag doping layer that is to be applied in a subsequent process step, which improves the switching characteristics of the CBRAM memory cell altogether.

LIST OF REFERENCE SIGNS 1 first electrode or bottom electrode
2 dielectric
3 dielectric
4 GeSe layer or active matrix material
5 surface layers of the GeSe layer
6 reactively sputtered particles of Se, $SeO_x$, $H_2Se$, and Ge

What is claimed is:

1. A method for manufacturing a resistively switching CBRAM semiconductor memory, the method comprising:
   generating an active matrix material layer or a GeSe layer that is adapted to be placed in a substantially electroconductive state by an electrochemical switching processes;
   after the generation of the active matrix material layer or GeSe layer, performing a reactive sputter etching process in which the surface layer of the active matrix material layer or GeSe layer is removed at least partially so as to modify the surface structure thereof; and
   after performing the reactive sputter etching process, forming an Ag doping layer on a cleaned surface layer of the GeSe layer.

2. The method according to claim 1, wherein, by means of the reactive sputter etching process, the surface structure of the GeSe layer and chemical bonds therein are re-organized and superfluous, weakly bound or clustered selenium is removed.

3. The method according to claim 1, wherein the Ag doping layer is generated without the formation of AgSe conglomerates.

4. The method according to claim 1, wherein chemical bonds in the surface structure of the GeSe layer are re-organized and superfluous, weakly bound or clustered selenium is removed.

5. The method according to claim 1, wherein at least partial steps for cleaning or modification of the surface of the GeSe layer are performed directly after generation of the GeSe layer and without an interruption of a vacuum or without intermediate ventilation in a processing chamber of a sputter coating facility.

6. The method according to claim 1, wherein, after performing reactive sputter etching, an Ag doping layer is deposited on the GeSe layer in a subsequent process step without an interruption of a vacuum or without intermediate ventilation in a processing chamber of a sputter coating facility.

7. The method according to claim 1, wherein a surface activation or an activation of surface atoms of the GeSe layer is performed by an energy-rich plasma radiation.

8. The method according to claim 1, wherein germanium atoms, selenium atoms and impurity atoms, are solved out of the surface of the GeSe layer by pulse transmission of a penetrating sputter ion.

9. The method according to claim 1, wherein sputter ions that are directed to the GeSe layer are accumulated at least partially in layers close to the surface of the GeSe layer so as to react with weakly bound selenium atoms to form volatile selenium oxide or hydrogen selenide.

10. The method according to claim 1, wherein a reactive gas/sputter gas is used which forms a volatile selenium compound with the selenium at the surface of the GeSe layer.

11. The method according to claim 1, wherein a reactive gas/sputter gas with oxygen or hydrogen ions is used.

12. The method according to claim 1, wherein, during the reactive sputter etching process, the GeSe layer is removed by a layer thickness of approximately 2 nm to 5 nm.

13. The method according to claim 1, wherein, for generating an Ag doping layer, a dc-magnetron sputter process with an Ag element target with argon as a sputter gas at a pressure of approximately 4 to $5 \times 10^{-3}$ mbar and a dc-sputter power in the range of approximately 1 to 3 kW is used.

14. The method according to claim 1, wherein the GeSe layer is deposited in prefabricated vias on a substrate.

15. The method according to claim 1, wherein the GeSe layer is at least temporarily impacted with a bias voltage, the bias voltage being adjustable in a controlled manner and being in an eV range.

16. The method according to claim 15, wherein sputter particles used during the reactive sputter process accept kinetic energy that is determined by the bias voltage present at the GeSe layer.

17. The method according to claim 1, wherein the GeSe layer is generated by rf-magnetron sputtering of a GeSe compound target with a layer thickness of approximately 50 nm.

18. The method according to claim 17, wherein, for rf-magnetron sputtering, argon is used as a sputter gas at a pressure of approximately 4 to $7 \times 10^{-3}$ mbar and a HF sputter power in a range of approximately 1 to 3 kW.

19. The method according to claim 1, wherein the reactive sputter etching process is performed at a gas pressure in the range of $10^{-2}$ to $3 \times 10^{-3}$ mbar.

20. The method according to claim 19, wherein an active sputter time is few minutes and in a range of 1 to 3 minutes.

21. A method for manufacturing a resistively switching CBRAM semiconductor memory, the method comprising:

forming a bottom electrode;

forming an active matrix material layer comprising undoped SeGe;

cleaning a top surface of the active matrix material layer using a sputter etching process; and after performing the sputter etching process, depositing a doping layer on the cleaned top surface of the active matrix material layer.

22. The method of claim 21, wherein the cleaning comprises:

cleaning and reorganizing the top surface by transmitting inert gas ions or reactive gas ions onto the top surface;

activating the surface of the active matrix material by an energy rich plasma radiation; and reacting loosely bound atoms of the active matrix material with a reactive gas to form a volatile compound.

23. The method of claim 21, wherein the doping comprises silver.

* * * * *